(12) United States Patent
Mule'Stagno et al.

(10) Patent No.: US 6,391,662 B1
(45) Date of Patent: May 21, 2002

(54) PROCESS FOR DETECTING AGGLOMERATED INTRINSIC POINT DEFECTS BY METAL DECORATION

(75) Inventors: Luciano Mule'Stagno, St. Louis, MO (US); Robert J. Falster, London (GB)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/661,822

(22) Filed: Sep. 14, 2000

Related U.S. Application Data
(60) Provisional application No. 60/155,725, filed on Sep. 23, 1999, and provisional application No. 60/175,506, filed on Jan. 11, 2000.

(51) Int. Cl.[7] ............................................. H01L 21/00
(52) U.S. Cl. ........................... 438/8; 216/84; 252/79.3; 438/714; 438/715
(58) Field of Search ................................ 216/2, 84, 85; 252/79.2, 79.3, 79.4; 438/8, 14, 16, 715, 745, 751, 753

(56) References Cited

U.S. PATENT DOCUMENTS

| | | |
|---|---|---|
| 5,487,354 A | 1/1996 | Von Ammon et al. |
| 5,667,584 A | 9/1997 | Takano et al. |
| 5,728,211 A | 3/1998 | Takano et al. |
| 5,766,976 A | 6/1998 | Majima |
| 5,935,320 A | 8/1999 | Graef et al. |
| 5,968,264 A | 10/1999 | Iida et al. |
| 5,980,720 A | 11/1999 | Park et al. |
| 6,045,610 A | 4/2000 | Park et al. |

FOREIGN PATENT DOCUMENTS

| | | |
|---|---|---|
| DE | 43 23 964 A1 | 3/1996 |
| EP | 0 962 557 A1 | 12/1999 |
| WO | 98-45507 A1 | 10/1998 |
| WO | 98-45508 A1 | 10/1998 |
| WO | 98-45509 A1 | 10/1998 |
| WO | 98-45510 A1 | 10/1998 |
| WO | 00-08677 A1 | 2/2000 |
| WO | 00-13211 A2 | 3/2000 |
| WO | 00-34999 A2 | 6/2000 |

OTHER PUBLICATIONS

Kitano, T., "Identification of Vacancy Clusters in FZ–Si Crystals", Phys. Stat. Sol., vol. 127 (1991), pp. 341–347.

A.J.R. de Kock, "The Elimination of Vacancy–Cluster Formation in Dislocation–Free Silocon Crystals", *J. Electrochem. Soc.: Solid State Science*, Nov. 1971, pp. 1851–1856.

A.M. Eidenzon et al., "Influence of growth rate on swirl defects in large dislocation–free crystals of silocon grown by the Czochralski method", *Soviet Physics Crystallography*, Sep.–Oct. 1985, pp. 576–580, 30(5).

Masaki Majima et al., "High–sensitivity Defect Evaluation by a New Preferential Etching Technique for Highly As–doped Si Crystals", *Japanese Journal of Applied Physics*, Oct. 10, 1997, pp. 6195–6199, vol. 36, Part 1, No. 10, Tokoyo, JP.

(List continued on next page.)

*Primary Examiner*—William A. Powell
(74) *Attorney, Agent, or Firm*—Senniger, Powers, Leavitt & Roedel

(57) ABSTRACT

A process for revealing agglomerated intrinsic point defects in a single crystal silicon sample. The process includes heat-treating the single crystal silicon sample, cooling the heat-treated sample and then coating a surface of the cooled sample with a composition containing a metal which is capable of decorating agglomerated intrinsic point defects. The coated sample is then heat-treated in an inert atmosphere at a temperature and for a time sufficient to diffuse the metal into the sample. A non-defect delineating etch is performed, followed by a defect delineating etch to reveal the decorated agglomerated intrinsic point defects.

30 Claims, 7 Drawing Sheets

OTHER PUBLICATIONS

N.L.. Puzanov et al., "Harmful Microdefects in the Seed –End Portion of Large–Diameter Silicon Ingots", *Inorganic Materials,*, Aug. 1997, pp. 765–769, vol. 33, No. 8.

Nikolai L. Puzanov et al., "Modelling microdefect distribution in dislocation–free Si crystals grown from the melt", *Journal of Crystal Growth*, 178 (1997), pp. 468–478.

Tsuyoshi Yamauchi et al., "Application of Copper–Decoration Method to Characterize As–Grown Czochralski–Silicon", *Japanese Journal of Applied Physics*, Apr. 15, 1992, pp. L 439–L–442, vol. 31, Part 2, No. 4b, Tokoyo, JP.

PCT/US 00/25455 International Search Report dated Sep. 18, 2000.

English Abstract of German Publication No. 43 23 964.

Chiou, H–D, "The Effects of Preheatings on Axial Oxygen Precipitation Uniformity in Czochralski Silicon Crystals", J. Electrochem. Soc., 1992, pp. 1680–1684, vol. 139, No. 6, The Electrochemical Society, Inc.

Eidenzon, A.M., et al., "Defect–Free Silicon Crystals Grown by the Czochralski Technique", Inorganic Materials, 1997, pp. 219–225, vol. 33, No. 3, Interperiodica Publishing.

Eidenzon, A.M., et al., "Influence of Growth Rate on Swirl Defects in Large Dislocation–Free Crystals of Silicon Grown by the Czochralski Method", Sov. Phys. Crystallogr., 1985, pp. 576–580, vol. 30, No. 5, American Institute of Physics.

Jacob, M., et al., "Determination of Vacancy Concentration in the Bulk of Silicon wafers by Platinum Diffusion Experiments", J. Appl. Phys., pp. 182–191, vol. 82, No. 1, American Institute of Physics.

Jacob, et al., "Influence of RTP on Vacancy Concentrations", Mat. Res. Soc. Symp. Proc., 1998., pp. 129–134, vol. 490, Materials Research Society.

Mule'Stagno, L., et al., "Gettering of Copper in Bonded Silicon Wafers", Electrochemical Society Proceedings, pp. 176–182, vol. 96, No. 3.

Zimmermann, H. et al., "Gold and Platinum Diffusion: The Key to the Understanding of Intrinsic Point Defect Behavior in Silicon", Applied Physics A Solids and Surfaces, 1993, pp. 121–134, vol. A55, No. 1.

Puzanov, N., et al., "Relaxation in a System of Point Defects in a Growing Dislocation Free Crystal of Silicon", Sov. Phys. Crystallogr, 1986, pp. 219–222, vol. 31, No. 2, American Institute of Physics.

De Kock, A.J.R., et al., "Effect of Growth Parameters on Formation and Elimination of Vacancy Clusters in Dislocation–Free Silicon Crystals", Journal of Crystal Growth, (1974), pp. 311–320, vol. 22, North–Holland Publishing Co.

De Kock, A.J.R., et al., "The Effect of Doping on the Formation of Swirl Defects in Dislocation–Free Czochralski–Grown Silicon Crystals", Journal of Crystal Growth, (1980), pp. 718–734, vol. 49, North–Holland Publishing Company.

Kissinger, G., et al., "A Method for Study the Grown–In Defect Density Spectra in Czochralski Silicon Wafers", J. Electrochem. Soc., pp. 1447–1456, (1997), vol. 144, No. 4, Published by The Electrochemical Society, Inc.

Puzanov, N.I., et al., "Relaxation in a System of Point Defects in a Growing Dislocation–Free Crystal of Silicon", Kristallografiya, (1986), pp. 373–379, vol. 31, Published by the American Institute of Physics.

Shimura, Fumio, "Physical Characterization", Semiconductor Silicon Crystal Technology, (1989), pp. 243–278, Published by Academic Press Limited, London.

Shimura, Fumio, "Decoration Technique", Semiconductor Silicon Crystal Technology, (1989), pp. 260, Published by Academic Press Limited, London.

Shimura, Fumio, "Microdefects", Semiconductor Silicon Crystal Technology, (1989), pp. 282–284, Published by Academic Press Limited, London.

Yamagishi, H., et al., "Recognition of D Defects in Silicon Single Crystals by Preferential Etching and Effect on Gate Oxide Integrity", Semicond. Sci. Technol., (1992), pp. A135–A140, vol. 7, IOP Publishing Ltd.

FIG. 6A
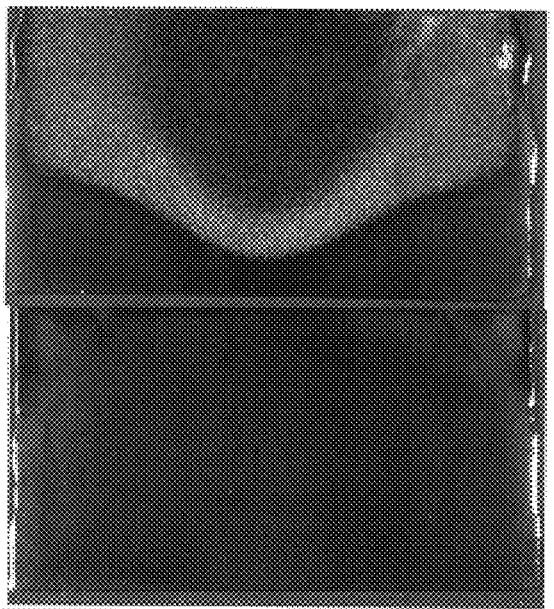
FIG. 6B
FIG. 6C
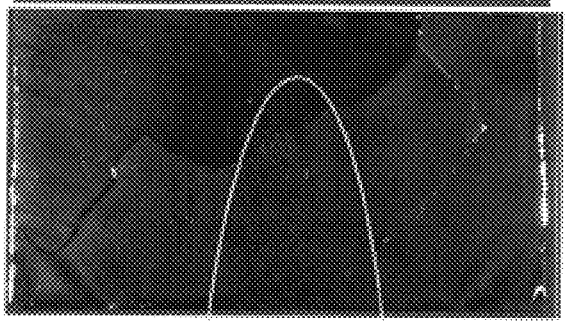
FIG. 6D
FIG. 6E
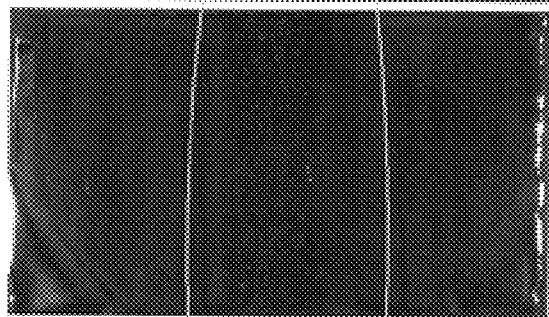
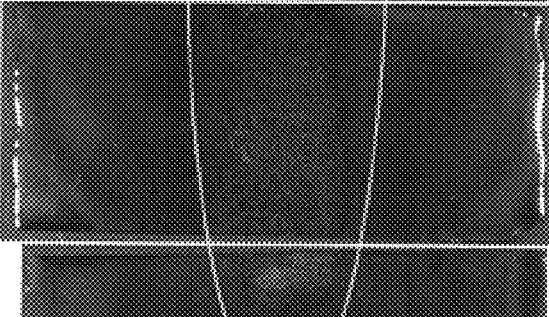
FIG. 6F

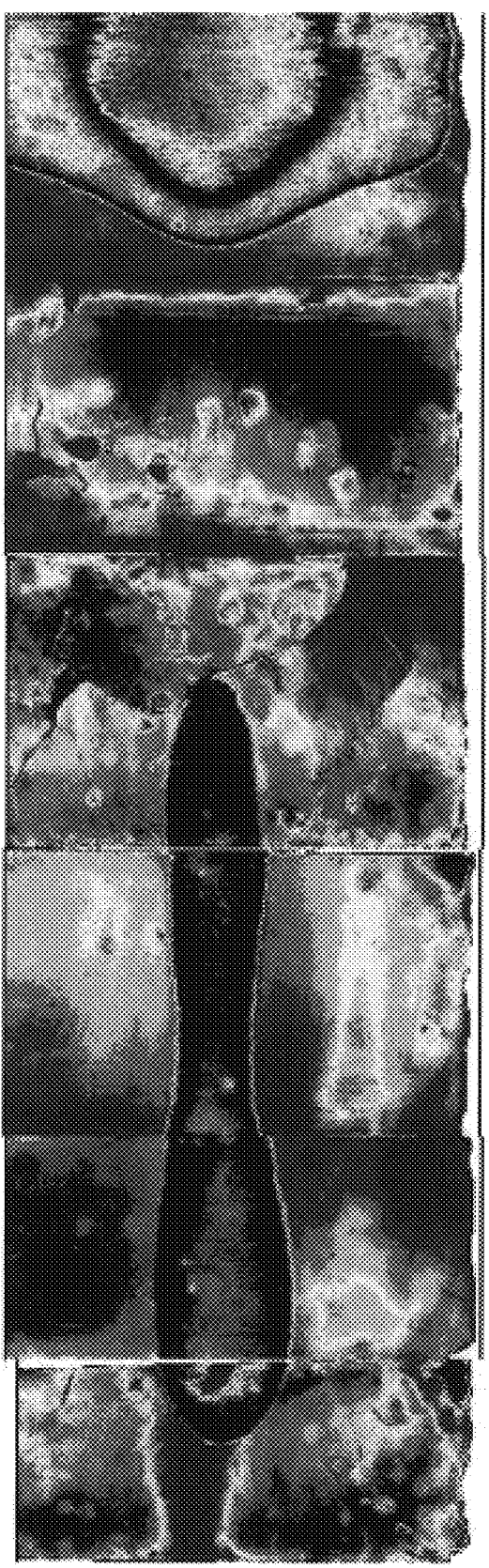
FIG. 8A
FIG. 8B
FIG. 8C
FIG. 8D
FIG. 8E
FIG. 8F

PROCESS FOR DETECTING AGGLOMERATED INTRINSIC POINT DEFECTS BY METAL DECORATION

REFERENCE TO RELATED APPLICATION

This application claims priority from U.S. provisional application, U.S. Ser. No. 60/155,725, filed on Sep. 23, 1999 and U.S. provisional application, U.S. Ser. No. 60/175,506 filed on Jan. 11, 2000.

BACKGROUND OF THE INVENTION

The present invention relates generally to a process for evaluating the quality of single crystal silicon. More particularly, the present invention relates to an improved process for detecting the presence of B-defects, formed by the agglomeration of silicon self-interstitial point defects, by means of metal decoration and silicon etching.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and then a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process, but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e., a concentration above the solubility limit) of intrinsic point defects, which are known as vacancies and self-interstitials. It is understood that the type and initial concentration of these point defects in the silicon, which become fixed at the time of solidification, are controlled by the conditions under which the single crystal silicon ingot is grown. (See, e.g., PCT/US98/07365 and PCT/US98/07304.) If the concentration of such point defects reaches a level of critical supersaturation within the single crystal silicon, and if the mobility of the point defects is sufficiently high, a reaction, or an agglomeration event, will likely occur.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques, such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied. However, it is generally believed that two types of such defects exist, commonly being referred to as A-defects and B-defects (or A- and B- "swirls" or "clusters"). A-defects are larger and more easily detected by means common in the art, as compared to B-defects. A-defects are commonly regarded as being low densities of interstitial-type dislocation loops or networks. Less is known about B-defects, primarily because they are much smaller in size and also because, to-date, methods for easily and reliably detecting such defects does not exist. However, at least some believe B-defects are not dislocation loops but rather are loosely packed three-dimensional agglomerates of silicon self-interstitials and impurity atoms of some kind. (See, e.g., F. Shimura, *Semiconductor Silicon Crystal Technology*, Academic Press, Inc., San Diego Calif. (1989) at pages 282–284 and the references cited therein.) Although A- and B-defects are not believed to be responsible for gate oxide integrity failures, an important wafer performance criterion, A-defects are at least widely recognized to be the cause of other types of device failures usually associated with current leakage problems. B-defects, on the other hand, are currently of less concern, primarily because of their smaller size. However, this is likely to change in the future as integrated circuit manufacturers continue to make smaller devices.

The density of such vacancy and self-interstitial agglomerated defects in Czochralski silicon is conventionally within the range of about $1*10^3/cm^3$ to about $1*10^7/cm^3$. While these values are relatively low, agglomerated intrinsic point defects are of rapidly increasing importance to device manufacturers because such agglomerated defects can severely impact the yield potential of the material in the production of complex and highly integrated circuits. As a result, accurate and efficient detection of such defects is critical for purposes of both quality assurance and process control.

Historically, agglomerated intrinsic point defects have been detected by processes wherein a sample of the single crystal silicon is chemically treated, and then inspected using an optical microscope or a scanning electron microscope. (See, e.g., F. Shimura at pages 243–271.) For example, the silicon sample may be treated with an etch solution, such as a Secco etch solution, in order to delineate agglomerated defects. Areas of the silicon which contain such defects may appear as "pits" or "hillocks" on the surface of the sample. The sample is then inspected using optical microscopy, and the pits or hillocks are counted.

As an alternative to the etching process, the quality of a single crystal silicon sample has also been evaluated by chemically treating the sample with copper or some other metal, such as aluminum, nickel, iron or lithium. Typically, copper decoration has involved covering the surface of the sample with copper nitrate and then heating it in an argon atmosphere for 30 minutes at 950° C. or more. (See, e.g., F. Shimura at 260.) Like the etching process, the sample is then inspected using optical or infrared microscopy in order to count the defects which are present.

Although the above processes allow for the detection of agglomerated intrinsic point defects, both require the aid of some form of instrumentation in order to detect the defects, after such defects have been delineated by chemical treatment. Such detection processes are time consuming, prohibitively so when used as a means of process control for the production of single crystal silicon. In addition, sample inspection using microscopy typically involves examining only a very small portion of the sample surface. Therefore, this approach often leads to confusion due to inaccurate or inconsistent results because, depending upon what area of the surface is examined, areas where defects are present may be only partially observed or entirely overlooked. Furthermore, existing methods of defect detection are generally inconsistent and unreliable for detecting smaller B-defects; in fact, because of their small size, B-defects are often not detected at all.

In view of the foregoing, a need continues to exist for a process which allows for the more efficient and accurate detection of agglomerated intrinsic point defects in single crystal silicon, and particularly B-defects; a process which may be performed in a sufficiently short period of time, such that single crystal silicon growth conditions may be efficiently monitored to ensure the formation of agglomerated defects are minimized or eliminated.

SUMMARY OF THE INVENTION

Among the objects of the invention, therefore, is the provision of a process for more efficiently and reliably detecting the presence of agglomerated intrinsic point defects, particularly defects associated with the agglomeration of silicon self-interstitials, and more particularly B-type agglomerated interstitial defects; the provision of a process for detecting the presence of slip dislocations; the provision of a process for delineating agglomerated intrinsic point defect precipitation zones; the provision of a process for differentiating the precipitation behavior of oxygen precipitates; the provision of a process which allows for the detection of such defects visually under ordinary or enhanced lighting conditions and without the aid of microscopy or other instrumentation, such as laser scattering or X-ray diffraction; the provision of a process for delineating the interface between vacancy dominant regions and silicon self interstitial dominant regions (i.e., the V-I boundary); and, the provision of a process which allows for such visual inspection, thus providing the ability to efficiently identify and distinguish regions within the sample in which the types of intrinsic point defects are different.

Briefly, therefore the present invention is directed to an improved process for delineating B-type agglomerated silicon self-interstitial defects in a single crystal silicon sample. The process comprises heat-treating the single crystal silicon sample at a temperature and for a time sufficient to thermally stabilize B-defects present in the sample, such that these defects are incapable of being dissolved upon a subsequent thermal treatment. The heat-treated sample is then cooled, and a surface of the heat-treated sample is coated with a composition containing a metal which is capable of decorating the stabilized B-defects. The coated sample is then heat-treated at a temperature and for a time sufficient to diffuse the metal into the sample. The heat-treated sample containing the metal is cooled, causing the metal to become critically supersaturated and precipitate at the stabilized B-defect sites. A non-defect delineating etch is performed, followed by a defect delineating etch to reveal the decorated B-defects.

The present invention is further directed to an improved process for revealing slip dislocations in a single crystal silicon sample. The process comprises optionally heat-treating the single crystal silicon sample and cooling the heat-treated sample and then coating a surface of the cooled sample with a composition containing a metal which is capable of decorating slip dislocations. The coated sample is then heat-treated in an inert atmosphere at a temperature and for a time sufficient to diffuse the metal into the sample. The heat-treated sample containing the metal is cooled, causing the metal to become critically supersaturated and precipitate at the slip dislocations. A non-defect delineating etch is performed, followed by a defect delineating etch to reveal the decorated slip dislocations.

Other objects and features of this invention will be in part apparent and in part pointed out hereinafter.

BRIEF DESCRIPTION OF THE DRAWINGS

FIGS. 6a–6f are photoprints of a series of photographs showing sequential segments (axial cuts) of the single crystal silicon ingot depicted in FIGS. 5a–5f, each segment being treated in accordance with a second embodiment of the process of the present invention, showing in detail regions containing decorated B-defects. The photoprints of each segment have been placed in sequential order such that they depict approximately 790 mm along the axial length of the overall ingot.

FIGS. 8a–8f are images produced by a scan of the minority carrier lifetime of sequential segments (axial cuts) of the single crystal silicon ingot depicted in FIGS. 5a–5f, each segment being treated in accordance with a second embodiment of the process of the present invention, showing in detail regions containing decorated B-defects. The photoprints of each segment have been placed in sequential order such that they depict approximately 790 mm along the axial length of the overall ingot.

DETAILED DESCRIPTION OF THE PREFERRED EMBODIMENTS

Figure 1:
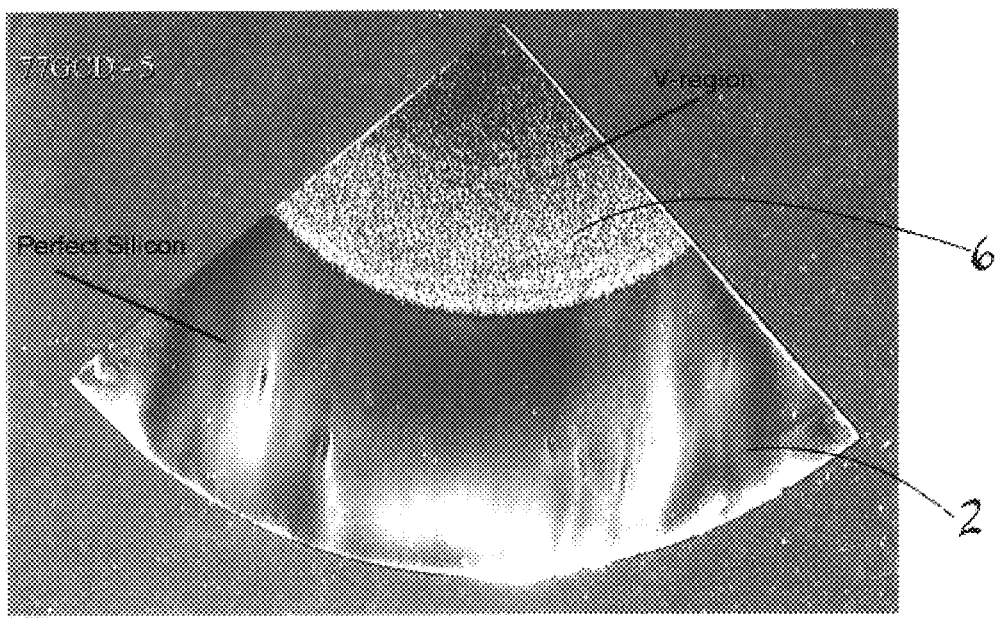
FIG. 1 is a photoprint of a photograph showing a quarter portion of a single crystal silicon sample treated in accordance with a first embodiment of the process of the present invention, showing in detail a region free of agglomerated intrinsic point defects.

In accordance with the process of the present invention, it has been discovered that metal decoration may be used in conjunction with silicon etching to reveal crystal lattice defects, oxygen precipitate defects and agglomerated intrinsic point defects, such as agglomerated vacancy defects and agglomerated interstitial defects, and in particular B-type agglomerated interstitial defects (hereinafter, B-defects), in such a way that these defects may be consistently and reliably detected visually (i.e., without the aid of defect detecting or magnifying instrumentation). Briefly, the present process involves treating a surface of a single crystal silicon sample, which may optionally be first subjected to a thermal anneal, with a defect-decorating metal, such as copper. The treated sample is then heated and cooled. Without being held to any particular theory, it is believed that, upon heating the metal diffuses into the silicon matrix of the sample. As the sample cools, the metal becomes supersaturated within the matrix and therefore precipitates heterogeneously at sites where defects such as slip dislocations, oxygen precipitates and agglomerated intrinsic point defects are present, forming large metal silicide precipitates. After these precipitates are revealed by chemical etching, they may be visually detected.

The single crystal silicon sample may be any sample of single crystal silicon including for example, a sample sliced from a single crystal silicon ingot, grown by the Czochralski method, the ingot having a diameter of at least about 100 mm, 150 mm, 200 mm, and may even have a diameter of at least about 300 mm or greater. Furthermore, the sample may be sliced from the constant diameter portion of the ingot by slicing the ingot perpendicular to the axis as in the case of a wafer, or may be obtained by slicing the ingot parallel to the axis as in the case of a slab. In addition, the single crystal silicon sample includes any portion of the ingot, wafer or slab described above.

In accordance with a first embodiment of the present process, a quantity of a highly concentrated solution, or paste, which contains a metal that will rapidly diffuse through the silicon matrix and selectively precipitate at sites where slip dislocations, oxygen precipitates and agglomerated defects are present, is applied to a surface of the single crystal silicon sample. The metal-containing composition is preferably applied as a thin layer, as evenly as possible, across the entire non-polished surface of the sample. If the sample does not have a non-polished surface, then the surface which is the roughest or the poorest in quality is preferably treated, or coated with the composition. Preferably, a copper-containing aqueous solution, such as copper nitrate, will be used to treat the surface of the sample. While the precise concentration may vary, typically the solution has a concentration of at least about 10 mg/ml, 20 mg/ml, 30 mg/ml or more. Preferably, however, the solution is saturated with the copper-containing compound.

It is to be noted that while copper is the preferred metal by which to form silicide precipitates, and thus "decorate" the slip dislocations, oxygen precipitates and agglomerated intrinsic point defects, other metals which rapidly diffuse through the silicon matrix may also be used. For example, metals such as aluminum, cobalt, gold, iron, lithium, nickel and platinum may also be used, although copper and lithium are preferred due to their higher rates of diffusion. It is to be further noted that, while a solution or paste is preferred because a more uniform application of the metal-containing composition may result, the composition may also be applied in other forms.

The quantity of the metal-containing composition which is used to coat the sample surface is dependent upon a number of factors, such as the concentration of the composition, the quality of the sample being evaluated, the type of metal being used, and the volume of silicon to be treated. Generally, a quantity is applied which is sufficient to ensure adequate decoration of defects which are present. An optimum quantity may be determined empirically for a given single crystal silicon growth process by, for example, varying the quantity applied to each one-quarter portion of the same sample. After the samples have been subjected to the present process, they may then be compared to determine which quantity provided the best results. Additional samples may be treated in order to further optimize the quantity to be applied. This empirical approach may be used to determine which metal provides the optimum results, as well.

Without being held to any particular theory, it is believed that a quantity of the composition is applied which is sufficient to allow the decorating metal to become critically supersaturated within the silicon matrix of the sample upon subsequent heating. Stated another way, the quantity of the composition which is applied is such that, upon heating, the metal may diffuse into the sample and result in a metal concentration which is in excess of the solubility limit of that metal in the silicon matrix once the sample cools.

As an example, for a one-quarter portion of a 150 mm diameter sample of single crystal silicon, the quantity of a saturated solution of copper nitrate that is applied to the surface may range from about 0.1 mls to about 2 mls, depending upon the thickness of the sample (i.e., the volume of silicon to be treated). As the volume of silicon to be treated increases, the quantity of the saturated copper nitrate solution applied to the sample surface also increases.

During the application of the composition, the sample is preferably heated by placing the sample on a heat source, such as a hot plate, with the surface that is to be treated being exposed. The sample is typically heated to a temperature ranging from about 45° C. to about 75° C. during the application. More preferably, the sample is heated to a temperature of about 55° C. to about 65° C. The sample is heated in order to evaporate water which is present in the solution, and allow the copper compound to dry, resulting in the formation of a thin residual salt layer on the treated surface. While this preheating step is not required, it is preferred because it acts to ensure the entire surface of the sample is thoroughly treated.

The sample is then inserted, typically with the treated side down, into a furnace, such as a muffle furnace. The atmosphere in which the sample is heated is not critical to the present invention and may for example be air. Preferably, however, the atmosphere in which the sample is heated is an inert atmosphere such as nitrogen or argon. The sample is heated to and maintained at a temperature for a period of time which is sufficient to allow the copper to diffuse into the silicon matrix. The duration over which the sample is heat treated is in part a function of the temperature. Typically, the sample will be heated to a temperature between about 500° C. and about 1200° C., for about 2 minutes to about 120 minutes or more, with the higher temperatures requiring shorter treatment times and vice versa. Preferably, however, the sample will be heated to a temperature between about 900° C. and about 1000° C. for about 5 minutes to about 15 minutes.

Regarding the agglomerated interstitial defects, experience to date suggests that while A-type agglomerated interstitial defects (hereinafter, A-defects) are stable at the heat treatment temperatures listed above, B-defects may dissolve at temperatures in excess of about 1100° C. and may even dissolve at temperatures greater than 1050° C. The silicon self-interstitials released by this dissolution may, at these temperatures, diffuse to the surface of the sample such that they do not re-agglomerate upon cooling, thus effectively annihilating the B-defects. Accordingly, the first embodiment of the present invention may result in less than complete decoration of B-defects, while remaining effective for the decoration of the remaining agglomerated intrinsic point defects, slip dislocations, and oxygen precipitates. Therefore, as discussed in detail below, an alternate embodiment of the present process may be employed to detect B-defects, whereby, these defects are first stabilized by a pre-annealing the sample at temperatures below about 1000° C. to render these defects incapable of being dissolved at temperatures above about 1100° C., prior to heat treating the sample.

The duration of the heat treatment is a function the heat treatment temperature, the thickness of the sample, or volume of silicon to be treated, and the desired diffusion depth of the metal. This means that for a particular temperature, longer treatment times are required as the desired diffusion depth increases. For example, if a quarter portion of a wafer, which may have a thickness ranging from about 0.5 mm to about 1 mm, is to be treated and it is desired that the copper diffuse entirely through the thickness of the wafer, the treatment time will range from about 10 minutes to about 20 minutes, and preferably about 14 minutes to about 16 minutes. In contrast, thicker samples, such as a slug or a slab of a single crystal silicon ingot which range in thickness from about 1 mm to about 2 mm or more, will be heat treated for about 25 minutes to about 35 minutes or more.

Once the sample has been heat treated for a sufficient period of time, the sample is removed from the furnace and quenched, or cooled. Typically, the sample is cooled to a temperature of less than about 40° C., and preferably less than about 30° C. so that it may be more easily handled. Experience to-date has shown that the rate of cooling may impact the results which are obtained. Specifically, it is believed that if the sample cools too slowly, the effectiveness of the metal decoration is diminished. Therefore, the sample is preferably placed on a thermally conductive plate or sample holder (e.g., copper plate) which acts as a heat sink and rapidly dissipates heat from the sample. Typically, the sample is cooled at a rate of at least about 5° C./second to about 10° C./second, and preferably at a rate of at least about 15° C./second to about 30° C./second.

It is to be noted, however, that a very thin sample may crack if cooled too rapidly. As a result, it is preferred that, upon being removed from the furnace, the sample be allowed to briefly cool in air before being placed on the heat sink. Typically, the sample will be allowed to cool in air for about 5 seconds to about 10 seconds.

After the sample has cooled sufficiently, any excess salt residue which may remain from the copper solution is removed from the treated surface. Typically, this residue is removed manually by means of physical abrasion, such as by rubbing the treated surface with sand paper followed by rinsing in water.

To further remove salt residues and surface precipitates, the sample is subjected to a first etching step using a non-defect delineating etching solution. Without being held to a particular theory, it is believed that during the heating step, the copper diffuses into the silicon matrix. As the sample cools, a portion of the copper may diffuse back to the surface of the sample and precipitate on the surface of the sample, thus masking the copper precipitates formed at slip dislocations, oxygen precipitates and agglomerated intrinsic point defect sites. Thus, it is preferred that the surface precipitates are removed using a non-defect delineating etch to remove the copper precipitates from the surface of the sample. Non-delineating etchants generally remove residues and precipitants without delineating the decorated defects.

In general, non-delineating etchants are comprised of a mixture of acids, which are generally comprised of a mixture of hydrofluoric acid and an oxidant. In practice, various diluents are added to the mixture of hydrofluoric acid and oxidant. Typically, solutions of hydrofluoric acid and nitric acid mixed with various diluents such as acetic acid, hydrochloric acid, phosphoric acid etc. are used as non-delineating etches. For example, a bright etch solution may used as the non-delineating etchant. A conventional bright etch solution comprises about 55% by volume nitric acid (supplied as about a 70 wt % $HNO_3$ in water), about 20% by volume hydrofluoric acid (supplied as about a 49 wt % HF in water), and about 25% by volume hydrochloric acid (concentrated, typically supplied as about a 38 wt % in water). Typically, a sample will be treated with a bright etch solution for about 5 minutes to about 15 minutes, and preferably about 8 minutes to about 12 minutes, with the etch time increasing as the size or area of the treated surface to be etched increases. The temperature of the bright etch solution is not narrowly critical; however, it generally ranges from about 25° C. to about 50° C. and may be as high as about 70° C. or greater. It is to be noted that instead of a bright etch solution as described above, other non-delineating etchants such as a mixed acid etch solution may alternatively be used. For example, a typical mixed acid non-delineating etchant is comprised of about 57% by volume nitric acid (supplied at 70% by weight in water), about 18% by volume hydrofluoric acid (supplied at 49% by weight in water) and about 25% by volume acetic acid. The concentration of the individual components in the non-delineating etchant is not narrowly critical, and may vary considerably without departing from the scope of the invention.

After the non-delineating etch, the sample is rinsed with deionized water and then subjected to a second etching step which acts to reveal, or delineate, slip dislocations, oxygen precipitates and agglomerated intrinsic point defects which may be present. Any standard defect-delineating etching solution may be employed. However, typically the sample is immersed in or treated with a Secco or Wright etch solution. Preferably, the sample will be etched using a Secco etch solution comprising about a 1:2 volumetric ratio of about 0.15 M potassium dichromate and hydrofluoric acid (supplied as about a 49 wt % HF in water). Alternatively, other delineating etchants may be used in place of the Secco etchant without departing from the scope of the invention. For example, a Sirtl etch comprised of about 33% by volume hydrofluoric acid (supplied at 49% by weight in water), 33% $CrO_3$ by volume (5 M solution) and 33% water by volume or Wright etch comprised of about 16.7% by volume nitric acid (supplied at 70% by weight in water, about 16.7% by volume $CrO_3$ (5M solution), 33% by volume acetic acid, 33% by volume water and 1 g copper nitrate can replace Secco etch. The concentration of individual components in the delineating etchant is not narrowly critical, and may vary considerably without departing from the scope of the invention. Furthermore, other delineating etchants comprising various compositions of chromium compounds, hydrofluoric acid and one or more diluents may be used in place of the Secco etch without departing from the scope of the invention.

The duration over which the sample is etched is in part a function of how much silicon is to be removed from the sample surface, in order to fully reveal the defects which are present. For example, if growth conditions are such that low densities of defects are likely, longer etching times may be required. In addition, the etch time may increase as the size or area of the treated surface to be etched increases. Typically, the sample is etched for about 35 minutes to about 55 minutes. Preferably, however, it is etched for about 40 minutes to about 50 minutes. Once the treated surface of the sample has been sufficiently etched, the sample is rinsed with deionized water and dried.

Etch solutions other than those herein described are standard in the art and may be alternatively used to clean and prepare the sample surface, as well as delineate the defects of interest. Accordingly, it is to be understood that, with regard to the above-referenced etching steps, the type, composition and concentration of the etch solutions may be other than that described herein without departing from the scope of the present invention, provided a non-delineated etchant is used followed by a delineating etchant.

In accordance with a second embodiment of the present process, the single crystal silicon sample may alternatively be subjected to an initial thermal anneal, prior to the surface application of the defect-decorating metal. This "pre-anneal" is preferred if B-defects are to be consistently and reliably detected. Without being held to any particular theory, it is generally believed that by heating the sample for a period of time prior to defect decoration, these smaller agglomerated interstitial defects may be grown and stabilized such that, upon being subjected to a subsequent heat treatment to diffuse the metal into the silicon matrix, the B-defects will not be dissolved. More specifically, it is generally believed that heating the sample for a period of time changes the nature of B-defects in some way, or possibly results in some type of silicon/oxygen interaction resulting from the oxygen commonly present in single crystal silicon grown in accordance with the Czochralski method, thereby increasing the visibility of these defects upon being decorated.

Typically the sample is pre-annealed at a temperature which is less than about 1050° C., preferably less than about 1000° C., for a time sufficient to stabilize these defects, such that they are not dissolved during the subsequent thermal treatment. In order for the B-defects to dissolve prior to becoming stabilized, the sample must be heated through the temperature at which B-defects may become stabilized at a rate such that the B-type defects begin to dissolve prior to becoming stabilized. For example, an increase in the temperature of about 1 to about 3° C./sec, typical for heat treating in a muffle furnace, would be sufficiently slow such that the B-defects would become stabilized prior to reaching the target temperature. Generally speaking, the sample will be heated to a temperature between about 500° C. and about 1050° C. for time period ranging from about 1 hour to about 8 hours, the higher temperatures requiring shorter times and vice versa. Although B-defects may become stabilized at temperatures below 500° C., the time required to stabilized the defects becomes increasingly greater. Preferably, the sample will be heated to a temperature between about 800° C. and about 1000° C. for about 2 hours to about 6 hours, more preferably to a temperature between about 850° C. and about 950° C. for about 3 hours to about 5 hours, and most preferably, to a temperature of about 900° C. for about 4 hours.

Once the stabilizing heat treatment is complete, the sample may be cooled to room temperature and stored until defect decoration and subsequent etching are to be performed. Alternatively, the sample may be immediately subjected to defect decoration, non-delineating etching and delineating etching. It is to be noted in this regard that if defect decoration is to proceed immediately, the sample need not be cooled completely to room temperature, but rather may be cooled to a temperature of about 45° C. or higher (as described in detail above, with reference to the application of the metal-containing composition while the sample is warm).

Once complete, the process of the present invention enables one to visually inspect, using the naked eye, the surface of the sample for the presence of slip dislocations, oxygen precipitates and agglomerated intrinsic point defects, and in particular, B-defects under ordinary incandescent or fluorescent lighting, collimated or enhanced lighting.

Although the defects are visible under ordinary lighting, bright or enhanced lighting makes the defects easier to discern, particularly with respect to decorated B-defects. As a result, the present invention allows for the detection of such defects without using microscopy or other types of instrumentation which aid with defect detection or magnification. The present process therefore provides the means by which to evaluate the quality of a single crystal silicon sample in less time and in a less complicated manner, as compared to conventional detection methods.

Visual inspection is made possible due to the fact that, when present, agglomerated intrinsic point defects, and particularly B-type defects, are made to appear significantly larger than when conventional metal decorating or etching methods are employed. Visual inspection allows the entire surface of the sample to be inspected at one time, and as a result, the present process significantly reduces the opportunity for inaccurate and inconsistent defect inspection. Also, the process of the present invention allows for the detection of agglomerated intrinsic point defects in less time, as compared to conventional processes, and is particularly well-suited to be used as a means for quality control or quality assurance in the production of single crystal silicon.

In addition to simply decorating defects which are present, the process also allows for a distinction to be made in regard to the origin of the detected agglomerated defects. Accordingly, the present process may be performed using a sample of single crystal silicon which has a central axis, a front side and a back side which are generally perpendicular to the axis, a circumferential edge, and a radius which extends from the central axis to the circumferential edge. The sample comprises an axially symmetric region which is substantially free of agglomerated defects. The axially symmetric region extends radially inwardly from the circumferential edge of the sample and has a width, as measured from the circumferential edge radially toward the center axis, which is at least about 30%, preferably about 40%, more preferably about 60%, and still more preferably about 80%, of the length of the radius of the sample.

Figure 2:
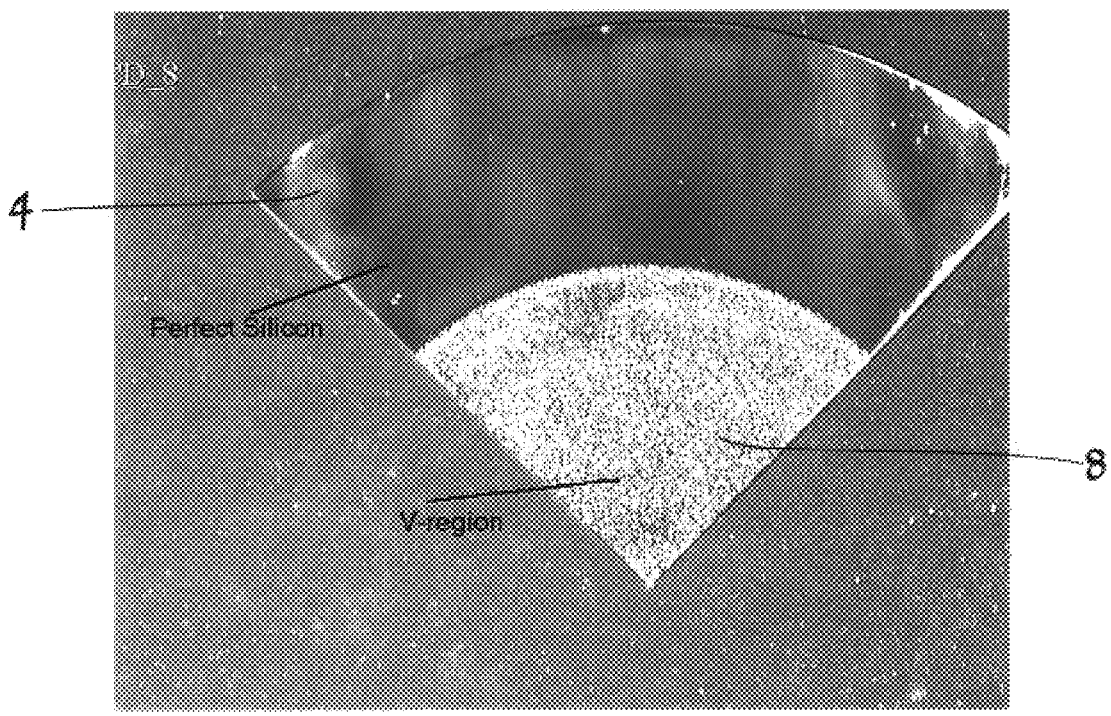
FIG. 2 is a photoprint of a photograph showing a quarter portion of a single crystal silicon sample treated in accordance with a first embodiment of the process of the present invention, showing in detail a region free of agglomerated intrinsic point defects.

When the width of the axially symmetric region is less than equal to the radius of the sample, a core of silicon containing agglomerated vacancy point defects may be present. Referring now to FIGS. 1 and 2, quarter portions of two wafers having such an axially symmetric region are shown, both having been subjected to the process of the present invention. As can be seen from the Figures, regions 2 and 4, respectively, are free of silicide precipitates; these regions therefore correspond to axially symmetric regions within the given samples which are free agglomerated intrinsic point defects. In contrast, regions 6 and 8, respectively, contain silicide precipitates; these regions therefore correspond to core regions of single crystal silicon material which contain agglomerated vacancy point defects.

Figure 3:
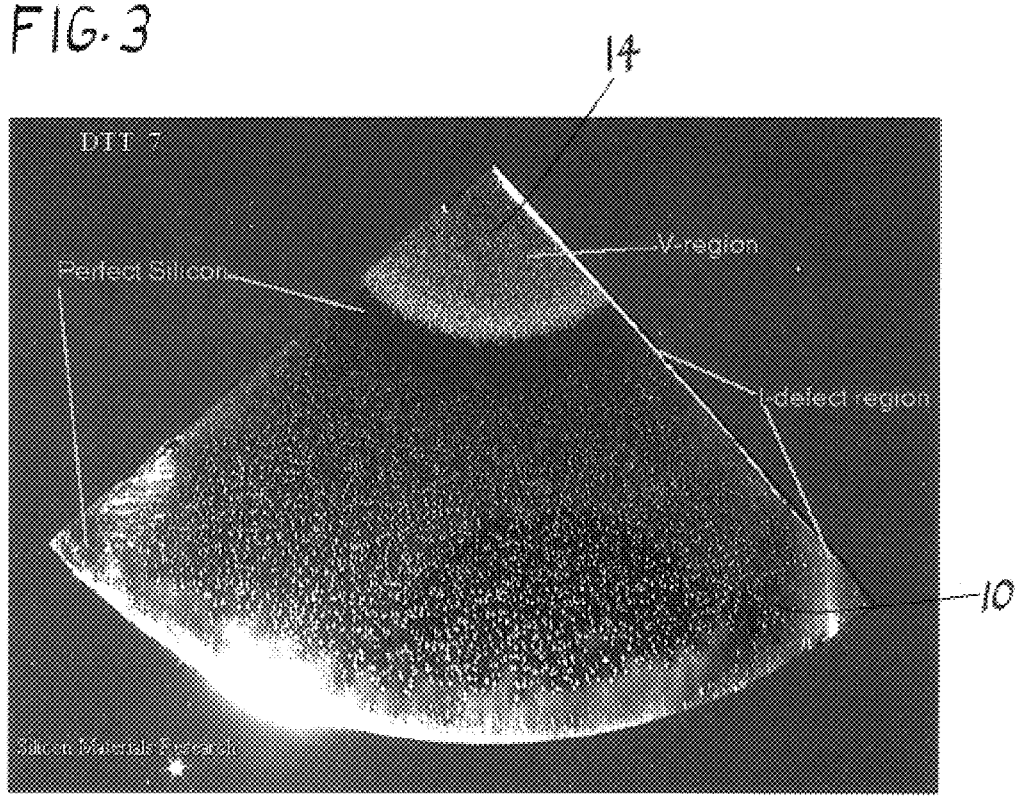
FIG. 3 is a photoprint of a photograph showing a quarter portion of a single crystal silicon sample treated in accordance with a first embodiment of the process of the present invention, showing in detail regions containing agglomerated vacancy defects and self-interstitial defects.
Figure 4:
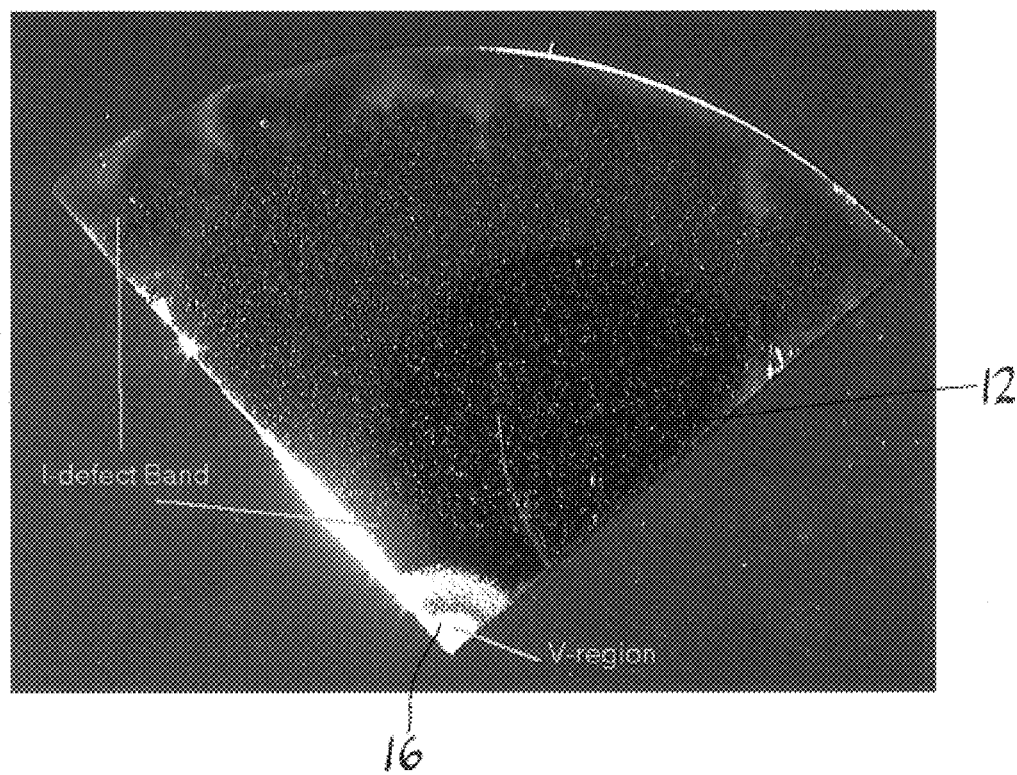
FIG. 4 is a photoprint of a photograph showing a quarter portion of a single crystal silicon sample treated in accordance with a first embodiment of the process of the present invention, showing in detail regions containing agglomerated vacancy defects and self-interstitial defects.
Figures 5A, 5B, 5C, 5D, 5E, 5F:
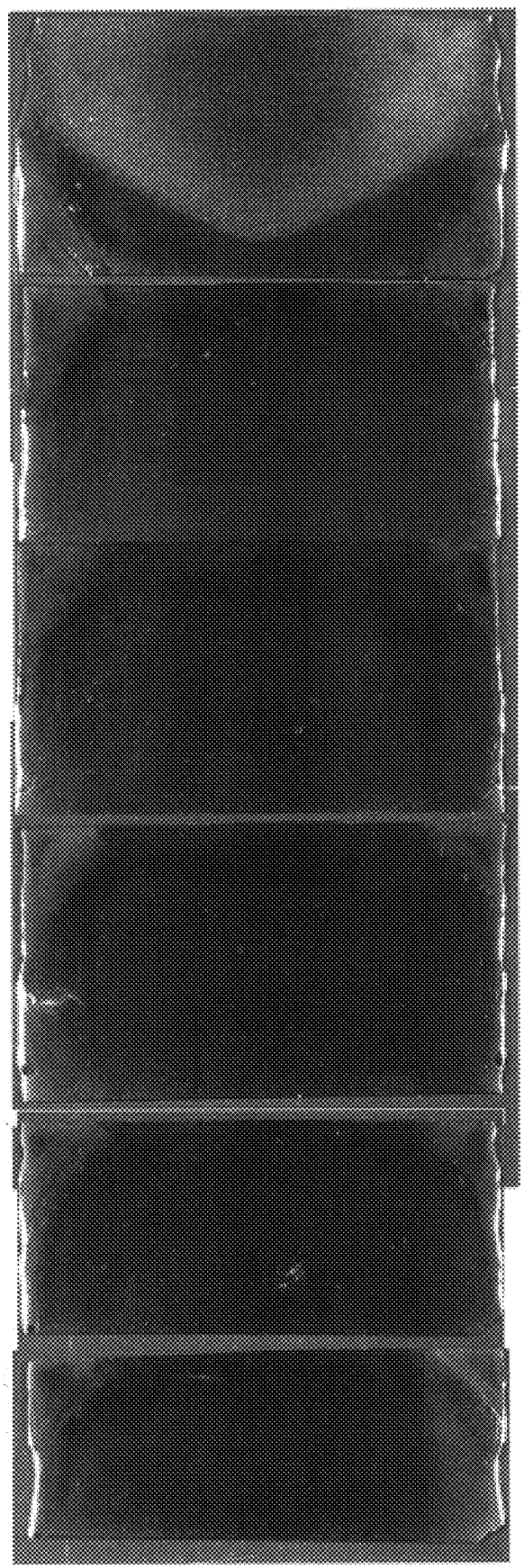
FIGS. 5a–5f are photoprints of a series of photographs showing sequential segments (axial cuts) of a single crystal silicon ingot, each segment being treated in accordance with a first embodiment of the process of the present invention. The photoprints of each segment have been placed in sequential order such that they depict approximately 790 mm along the axial length of the overall ingot.
Figures 7A, 7B, 7C, 7D, 7E, 7F:
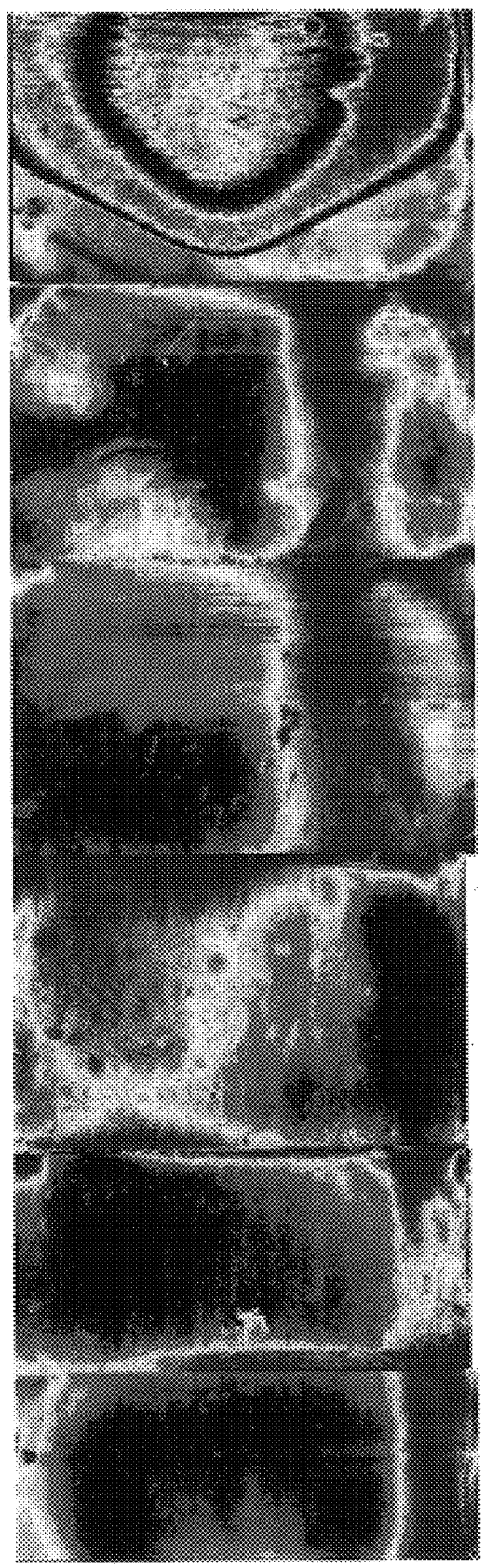
FIGS. 7a–7f are images produced by a scan of the minority carrier lifetime of sequential segments (axial cuts) of the single crystal silicon ingot depicted in FIGS. 5a–5f, each segment being treated in accordance with a first embodiment of the process of the present invention. The photoprints of each segment have been placed in sequential order such that they depict approximately 790 mm along the axial length of the overall ingot.

Referring now to FIGS. 3 and 4, it can be seen that the process of the present invention also provides the means by which to visually determine the type of intrinsic point defect which is predominant within a region that contains agglomerated intrinsic point defects. For example, regions 10 and 12, respectively, contain defects resulting from the agglomeration of silicon self-interstitial point defects. In contrast, regions 14 and 16, respectively, contain defects resulting from the agglomeration of vacancy point defects. As can be seen from these Figures, a noticeable difference in the size and density of the copper decorated defects exists for these regions, which thus allows for a distinction to be made between them.

Referring now to FIGS. 5*a*–5*f* and 6*a*–6*f*, it is to be noted that the second embodiment of the present process is particularly well-suited for purposes of detecting B-type agglomerated interstitial defects. More specifically, depicted in these figures are segments of a single Czochraksi-type silicon ingot (the ingot being cut in half axially, the halves being further segmented along their length). The segments from one half of the ingot (shown in FIGS. 5*a*–5*f*) were then subjected to the first embodiment of the present process, while the segments from the other half (shown in FIGS. 6*a*–6*f*) were subjected to the second embodiment of the present process (i.e., these segments were "pre-annealed" prior to the application of the metal-containing composition). Upon comparing the respective segments c–f, it will be noted that the "pre-anneal" segments clearly contain small white spots near the center of the ingot. The efficiency of this second embodiment at decorating B-defects is confirmed by examining FIGS. 7*a*–7*f* and 8*a*–8*f* (minority carrier lifetime maps of the same ingot segments; note that the segments of 8*c*–8*f* clearly contain a region of B-defects not detected in the other half of the ingot).

It is to be noted that, with respect to the visual detection of B-type defects, these defects may be observed under ordinary incandescent or flourescent lighting. However, some form of enhanced lighting may be employed to further enhance their detection.

Figure 9A:
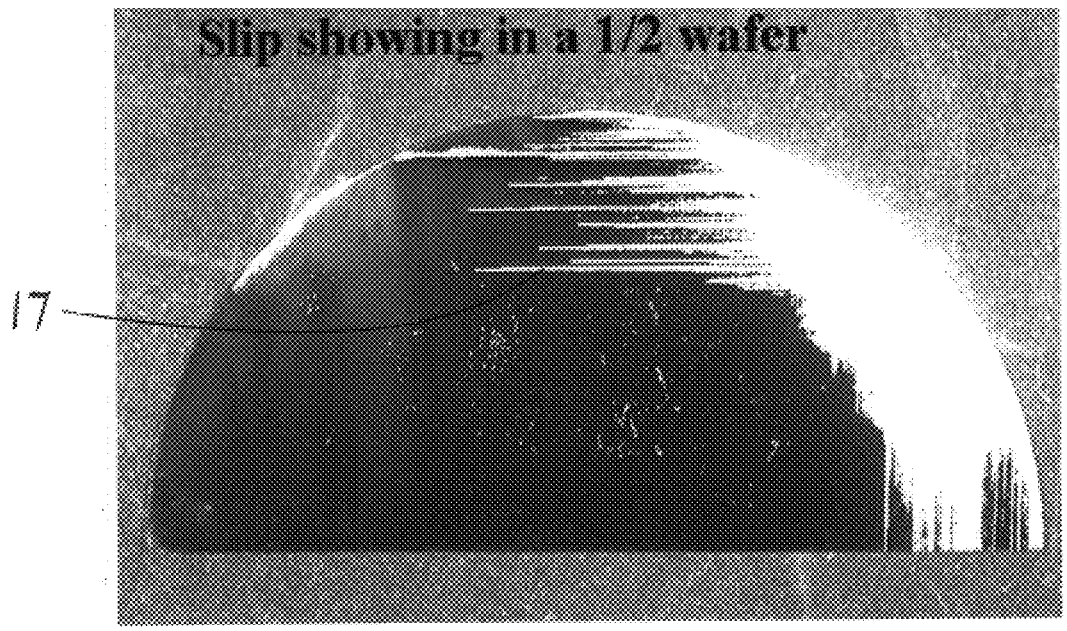
FIGS. 9(a) and 9(b) are photoprints of photographs showing a half portion of a single crystal silicon wafer and a slab sample sliced from a single crystal silicon ingot respectively, both the wafer and the slab were treated in accordance with the process of the present invention, revealing slip dislocations.
Figure 9B:
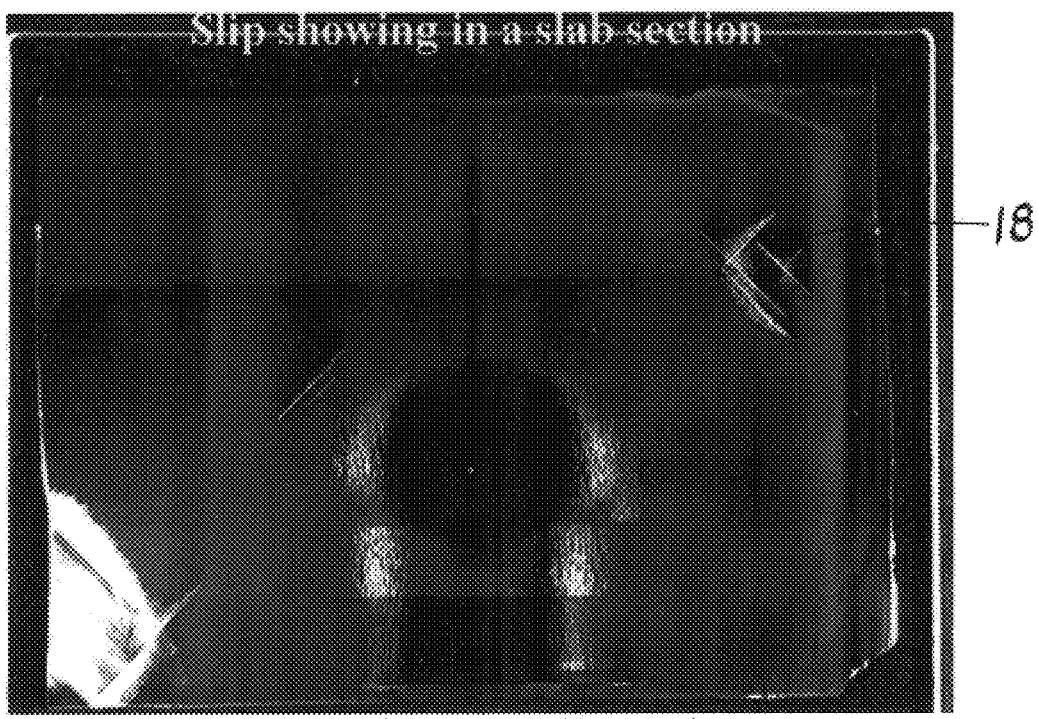

Referring now to FIGS. 9(*a*) and 9(*b*), it can be seen that the process of the present invention also provides the means by which to visually detect slip dislocations in single crystal silicon samples. In particular, FIG. 9(*a*) shows an image of half of a silicon wafer containing slip dislocations 17 and FIG. 9(*b*) shows an image of a slab cut from a silicon ingot containing slip dislocations 18. It is to be noted that slip dislocations are revealed by the process of the present invention and appear as white lines in FIGS. 9(*a*) and 9(*b*).

Definitions

It is to be noted that, as used herein, the following phrases shall have the given meanings: "agglomerated intrinsic point defects" shall mean defects caused (i) by the reaction in which vacancies agglomerate or (ii) by the reaction in which self-interstitials agglomerate; "agglomerated vacancy defects" shall mean agglomerated vacancy point defects caused by the reaction in which crystal lattice vacancies agglomerate, examples include D-defects, flow pattern defects, gate oxide integrity defects, crystal originated particle defects, and crystal originated light point defects; "agglomerated interstitial defects" shall mean agglomerated intrinsic point defects caused by the reaction in which silicon self-interstitial atoms agglomerate to form A-defects (including dislocation loops and networks) and B-defects; "B-defects" shall mean agglomerated interstitial defects which are smaller than A-defect and which are capable of being dissolved if subjected to a thermal treatment (e.g., heating at about 1100° C. or more for several seconds or several tens of second), provided they have not first been thermally stabilized as further described herein; "radius" shall mean the distance measured from a central axis to a circumferential edge of a single crystal silicon sample, such as a wafer, or an ingot slug or slab; "substantially free of agglomerated intrinsic point defects" shall mean a concentration of agglomerated defects which is less than the detection limit of these defects, which is currently about $10^4$ defects/cm$^3$; "vacancy dominated" and "self-interstitial dominated" shall mean material in which the intrinsic point defects are predominantly vacancies or self-interstitials, respectively; and, "visual detection of agglomerated intrinsic point defects," as well as variations thereof, shall refer to the detection of such defects using the naked eye under ordinary incandescent or fluorescent light sources, or optionally collimated or other enhanced light sources, but without the use of any instrumentation which would otherwise aid in defect detection or result in defect magnification, such as optical or infrared microscopy, X-ray diffraction, or laser scattering.

As various changes could be made in the above-described processes without departing from the scope of the invention, it is intended that all matter contained in the above description shall be interpreted as illustrative and not in a limiting sense.

We claim:

1. A process for revealing agglomerated intrinsic point defects and slip dislocations in a single crystal silicon sample, the process comprising:

thermally annealing the sample at a temperature and for a time period sufficient to stabilize B-defects, such that these defects may not be dissolved upon subsequent heating of the sample to a temperature in excess of about 1100° C.;

cooling the annealed sample;

coating a surface of the cooled sample with a composition containing a metal capable of decorating agglomerated intrinsic point defects;

heat-treating the coated sample in an inert atmosphere to diffuse the metal into the coated sample;

cooling the heat-treated sample to decorate the defects;

etching the surface of the decorated sample with a non-delineating etchant to remove residues and precipitants without delineating the decorated agglomerated intrinsic point defects; and, delineating the etched surface with a delineating etchant to reveal the decorated agglomerated intrinsic point defects.

2. The process as set forth in claim 1 further comprising the step of visually inspecting the delineated surface of the single crystal silicon sample for the presence of decorated agglomerated intrinsic point defects.

3. The process as set forth in claim 2 wherein the agglomerated intrinsic point defects are B-defects.

4. The process as set forth in claim 1 wherein the sample is thermally annealed at a temperature ranging from about 850° C. to about 950° C. for about 3 hours to about 5 hours.

5. The process as set forth in claim 4 wherein the sample is thermally annealed at a temperature of about 900° C. for about 4 hours.

6. The process as set forth in claim 1 wherein the metal is copper.

7. The process as set forth in claim 6 wherein the copper is present in an aqueous solution saturated with copper nitrate.

8. The process as set forth in claim 7 wherein the copper nitrate solution applied to the sample is dried prior to the heat treating the coated sample.

9. The process as set forth in claim 1 wherein the coated sample is heat-treated at a temperature ranging from about 900° C. to about 1000° C. for about 5 minutes to about 15 minutes.

10. The process as set forth in claim 1 wherein the coated sample is rapidly cooled after heat-treatment to a temperature of less than about 30° C.

11. The process as set forth in claim 1 wherein the coated sample is cooled at a rate of at least about 5° C./second and about 10° C./second after heat-treatment.

12. The process as set forth in claim 1 wherein the coated sample is cooled at a rate of at least about 15° C./second to about 30° C./second after heat-treatment.

13. The process as set forth in claim 1 wherein the non-defect delineating etch is a bright etch solution or a mixed acid etch solution.

14. The process as set forth in claim 13 wherein the sample is treated with a bright etch solution for about 8 to about 12 minutes.

15. The process as set forth in claim 1 wherein the defect delineating etch comprises treating the sample with a Secco etch solution.

16. The process as set forth in claim 15 wherein the sample is treated with the Secco etch solution for about 35 minutes to about 55 minutes.

17. The process as set forth in claim 1 wherein the single crystal silicon sample is sliced from a single crystal silicon ingot.

18. The process as set forth in claim 17 wherein the single crystal silicon sample is a single crystal silicon wafer.

19. A process for revealing slip dislocations in a single crystal silicon sample, the process comprising:

coating a surface of the sample with a composition containing a metal capable of decorating slip dislocations;

heat-treating the coated sample in an inert atmosphere to diffuse the metal into the coated sample;

cooling the heat-treated sample to decorate the slip dislocations;

etching the surface of the decorated sample with a non-delineating etchant to remove residues and precipitants without delineating the slip dislocations;

delineating the etched surface with a delineating etchant to reveal the decorated slip dislocations; and, visually inspecting the delineated surface of the single crystal silicon sample for the presence of slip dislocations.

20. The process as set forth in claim 19 wherein the metal is copper.

21. The process as set forth in claim 20 wherein the copper is present in an aqueous solution saturated with copper nitrate.

22. The process as set forth in claim 21 wherein the copper nitrate solution applied to the sample is dried prior to the heat treating the coated sample.

23. The process as set forth in claim 19 wherein the coated sample is heat-treated at a temperature ranging from about 900° C. to about 1000° C. for about 5 minutes to about 15 minutes.

24. The process as set forth in claim 19 wherein the coated sample is rapidly cooled after heat-treatment to a temperature of less than about 30° C.

25. The process as set forth in claim 19 wherein the coated sample is cooled at a rate of at least about 5° C./second and about 10° C./second after heat-treatment.

26. The process as set forth in claim 19 wherein the coated sample is cooled at a rate of at least about 15° C./second to about 30° C./second after heat-treatment.

27. The process as set forth in claim 19 wherein the non-defect delineating etch is a bright etch solution or a mixed acid etch solution.

28. The process as set forth in claim 27 wherein the sample is treated with a bright etch solution for about 8 to about 12 minutes.

29. The process as set forth in claim 19 wherein the defect delineating etch comprises treating the sample with a Secco etch solution.

30. The process as set forth in claim 29 wherein the sample is treated with the Secco etch solution for about 35 minutes to about 55 minutes.

* * * * *

UNITED STATES PATENT AND TRADEMARK OFFICE
CERTIFICATE OF CORRECTION

PATENT NO.      : 6,391,662 B1                                              Page 1 of 1
DATED           : May 21, 2002
INVENTOR(S)     : Luciano Mule'Stagno and Robert J. Falster It is certified that error appears in the above-identified patent and that said Letters Patent is hereby corrected as shown below:

Column 13,
Lines 5-6, "prior to the heat treating the coated sample." should read -- prior to heat treating the coated sample. --.

Column 14,
Line 18, "the heat treating the coated sample." should read -- heat treating the coated sample. --.

Signed and Sealed this

Eleventh Day of March, 2003

JAMES E. ROGAN
*Director of the United States Patent and Trademark Office*